US012761293B2

(12) United States Patent
Choi et al.

(10) Patent No.: US 12,761,293 B2
(45) Date of Patent: Oct. 13, 2026

(54) THREE-DIMENSIONAL MAGNETIC FIELD MEASUREMENT DEVICE AND MAGNETIC FIELD MAPPING SYSTEM

(71) Applicant: Daegu Gyeongbuk Institute of Science and Technology, Daegu (KR)

(72) Inventors: Hong Soo Choi, Daegu (KR); Jun Sun Hwang, Goyang (KR); Jin Young Kim, Daegu (KR); Awais Ahmed, Daegu (KR); Sarmad Ahmad Abbasi, Daegu (KR)

(73) Assignee: Daegu Gyeongbuk Institute of Science and Technology, Daegu (KR)

( * ) Notice: Subject to any disclaimer, the term of this patent is extended or adjusted under 35 U.S.C. 154(b) by 130 days.

(21) Appl. No.: 18/561,612

(22) PCT Filed: May 6, 2022

(86) PCT No.: PCT/KR2022/006466
§ 371 (c)(1),
(2) Date: Nov. 16, 2023

(87) PCT Pub. No.: WO2022/245023
PCT Pub. Date: Nov. 24, 2022

(65) Prior Publication Data

US 2024/0369649 A1 Nov. 7, 2024

(30) Foreign Application Priority Data

May 17, 2021 (KR) ........................ 10-2021-0063456

(51) Int. Cl.
*G01R 33/02* (2006.01)
*G01R 33/00* (2006.01)
*G01R 33/10* (2006.01)

(52) U.S. Cl.
CPC ..... *G01R 33/0206* (2013.01); *G01R 33/0005* (2013.01); *G01R 33/0047* (2013.01); *G01R 33/0094* (2013.01); *G01R 33/10* (2013.01)

(58) Field of Classification Search
CPC ............ G01R 33/0206; G01R 33/0005; G01R 33/0047; G01R 33/0094; G01R 33/10
See application file for complete search history.

(56) References Cited

U.S. PATENT DOCUMENTS 5,519,318 A * 5/1996 Koerner ................. G01C 17/30 324/252
11,187,761 B1 * 11/2021 Olsson .................. G01V 3/081
(Continued)

FOREIGN PATENT DOCUMENTS

CN 105607015 A 5/2016
JP 2010-190709 A 9/2010
(Continued)

OTHER PUBLICATIONS

Korean Office Action dated Feb. 15, 2023 for Korean Patent Application No. 10-2021-0063456.
(Continued)

*Primary Examiner* — Reena Aurora
(74) *Attorney, Agent, or Firm* — Sughrue Mion, PLLC

(57) ABSTRACT

The present invention relates to a three-dimensional magnetic field measurement device comprising a plurality of modules, wherein each of the modules is configured to be extensible in x-axis, y-axis, and z-axis directions, whereby magnetic field data in a three-dimensional space can be measured in real time without moving the device, a measurement area can be easily enlarged and reduced, power efficiency can be improved, and the size and weight of the device can be reduced.

13 Claims, 14 Drawing Sheets

(56) References Cited

U.S. PATENT DOCUMENTS

| | | | | |
|---|---|---|---|---|
| 11,719,716 | B1 * | 8/2023 | Toutov | G01R 33/0206 324/207.11 |
| 2014/0225601 | A1 | 8/2014 | Hobelsberger et al. | |
| 2015/0198678 | A1 | 7/2015 | Pilla | |
| 2017/0371009 | A1 | 12/2017 | Ross | |
| 2018/0311795 | A1 * | 11/2018 | Morton | B23Q 17/006 |

FOREIGN PATENT DOCUMENTS

| | | | |
|---|---|---|---|
| JP | 2018-54461 | A | 4/2018 |
| JP | 2018-72344 | A | 5/2018 |
| JP | 2019-211405 | A | 12/2019 |
| KR | 10-2006-0085570 | A | 7/2006 |
| KR | 10-2012-0086843 | A | 8/2012 |
| KR | 10-2012-0135221 | A | 12/2012 |
| KR | 10-2013-0132370 | A | 12/2013 |
| KR | 10-2015-0065998 | A | 6/2015 |
| KR | 10-1700758 | B1 | 1/2017 |
| KR | 10-2018-0074684 | A | 7/2018 |
| KR | 10-2088631 | B1 | 3/2020 |
| KR | 10-2020-0067693 | A | 6/2020 |
| KR | 10-2242113 | B1 | 4/2021 |

OTHER PUBLICATIONS

International Search Report for PCT/KR2022/006466 dated Aug. 16, 2022.

Extended European Search Report dated Jun. 24, 2025 from the European Patent Office in Application No. 22804878.1.

* cited by examiner a b

THREE-DIMENSIONAL MAGNETIC FIELD MEASUREMENT DEVICE AND MAGNETIC FIELD MAPPING SYSTEM

This Application is a National Stage of International Application No. PCT/KR2022/006466 filed May 6, 2022, claiming priority based on Korean Patent Application No. 10-2021-0063456 filed May 17, 2021.

TECHNICAL FIELD

The present invention relates to a magnetic field measurement device, and more particularly, to a three-dimensional (3D) magnetic field measurement device capable of simultaneously measuring magnetic fields in the x-axis, y-axis, and z-axis through coupling between modules.

BACKGROUND ART

FIG. 1 is a diagram schematically illustrating a mobile mapping system and measurement method of the related art. In the related art, in order to measure magnetic field data in a 3D space, measurement is performed by physically moving measurement points one by one using a measurement device including one magnetic sensor and one manipulator as shown in FIG. 1.

However, measuring magnetic field data in a 3D space using this method takes a long time for measurement because the device should be physically moved, has low movement accuracy, thus not guaranteeing measurement reliability and precision, and cannot measure a magnetic field in 3D space in real time.

In addition, FIG. 2 is a diagram schematically illustrating a magnetic field measurement device and measurement method. In the related art, as shown in FIG. 2, magnetic field data of a 3D space is measured by using a measurement device including a magnetic sensor in the form of a 2D array, while moving an array area.

However, measuring magnetic field data in a 3D space using this method may save time compared to the one-point measurement of the measurement device in FIG. 1, but, like the one-point measurement of the measurement device in FIG. 1, since magnetic field data has to be measured by moving the device, a measurement speed is slow and the movement accuracy is low, measurement reliability and precision cannot still be guaranteed, and in addition, although it is possible to secure real-time data on a surface being measured, it may be difficult to measure real-time data on other surfaces or spaces.

DISCLOSURE

Technical Problem

An object of the present invention is to provide a three-dimensional (3D) magnetic field measurement device which is capable of measuring magnetic field data in a 3D space in real time without moving the device and easily enlarging and reducing a measurement area and which is reduced in size and weight.

Technical Solution

In one general aspect, a three-dimensional (3D) magnetic field measurement device includes: a plurality of modules, wherein each of the plurality of modules includes: a circuit board; a plurality of magnetic field sensors mounted on the circuit board, arranged to be spaced apart from each other by a predetermined distance in x-axis and y-axis directions; and a z-axis connection portion formed on the circuit board, wherein the plurality of modules are separably connected in the z-axis direction by the z-axis connection portion, enabling measurement of x-axis, y-axis, and z-axis magnetic fields.

The z-axis connection portion may include: a z-axis insertion portion formed on one surface of the circuit board; and a z-axis protrusion portion formed on the other surface of the circuit board and inserted into a first insertion portion of another module adjacent in the z-axis direction.

The z-axis connection portion may electrically connect power and signals of different modules.

Each of the plurality of modules may further include: an x-axis connection portion connecting different modules in the x-axis direction.

The x-axis connection portion may include: an x-axis insertion portion formed in a positive x-axis direction; and an x-axis protrusion portion formed in a negative x-axis direction and inserted into the x-axis insertion portion of another module adjacent in the x-axis direction.

When the x-axis protrusion portion is inserted into the x-axis insertion portion, the circuit boards respectively formed in the different modules may be in close contact with each other without a space in the x-axis direction.

Each of the plurality of modules may further include: a y-axis connection portion connecting different modules in the y-axis direction.

The y-axis connection portion may include: a y-axis insertion portion formed in a negative y-axis direction; and a y-axis protrusion portion formed in a positive y-axis direction and inserted into the y-axis insertion portion of another module adjacent in the y-axis direction.

When the y-axis protrusion portion is inserted into the y-axis insertion portion, the circuit boards respectively formed in the different modules may be in close contact with each other without space in the y-axis direction.

Serial peripheral interface (SPI) communication may be performed between a microcontroller formed on the circuit board and the plurality of magnetic field sensors, and $I^2C$ communication may be performed between the microcontrollers formed in different modules.

In another general aspect, a magnetic field mapping system includes: the 3D magnetic field measurement device described above; and an output device receiving magnetic field data of the plurality of modules from the 3D magnetic field measurement device and generating a 3D magnetic field graph in real time.

The 3D magnetic field measurement device may further include a master module electrically connecting power and signals between the plurality of modules, connected to one of the plurality of modules, and connected to the output device.

The output device may generate the 3D magnetic field graph by setting spatial information of the plurality of magnetic field sensors based on an arrangement interval of the plurality of magnetic field sensors of the 3D magnetic field measurement device and a connection interval between the plurality of modules.

Advantageous Effects

The 3D magnetic field measurement device of the present invention has the advantage of being able to measure a 3D magnetic field at the current location of the device without moving the device and simultaneously measuring magnetic field data in real time.

Accordingly, by combining the real-time measurement ability of the 3D magnetic field measurement device of the present invention with artificial intelligence-enhanced learning, optimal conditions for magnetic field control and driving of a microrobot capable of controlling magnetic fields may be derived and magnetic field characteristics and inspection of a permanent magnet and electromagnet-based system may be efficiently performed, through which companies manufacturing magnetic field systems may more quickly and accurately evaluate the performance of a developed magnetic field system.

In addition, the 3D magnetic field measurement device 100 of the present invention may be manufactured at a lower price than similar conventional products, and may be used as a device for developing a magnetic field control system or as a device for magnetic field education in companies and educational institutions.

BEST MODE

Hereinafter, the technical idea of the present invention will be described in detail using the accompanying drawings.

Figure 1:
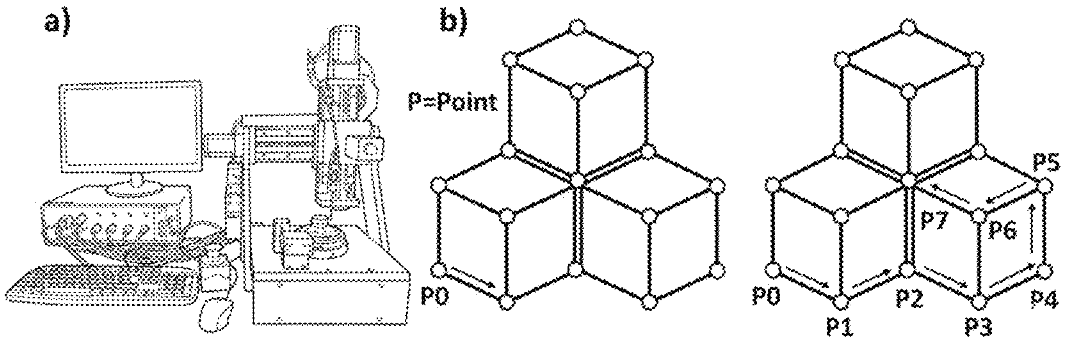
FIG. 1 is a diagram schematically illustrating a mobile mapping system and measurement method of the related art.
Figure 2:
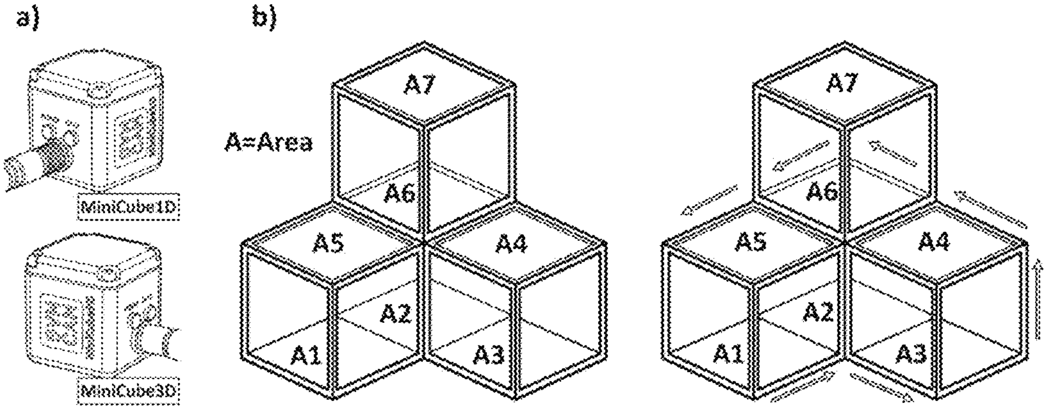
FIG. 2 is a diagram schematically illustrating the magnetic field measurement device and measurement method of the related art.
Figure 3:
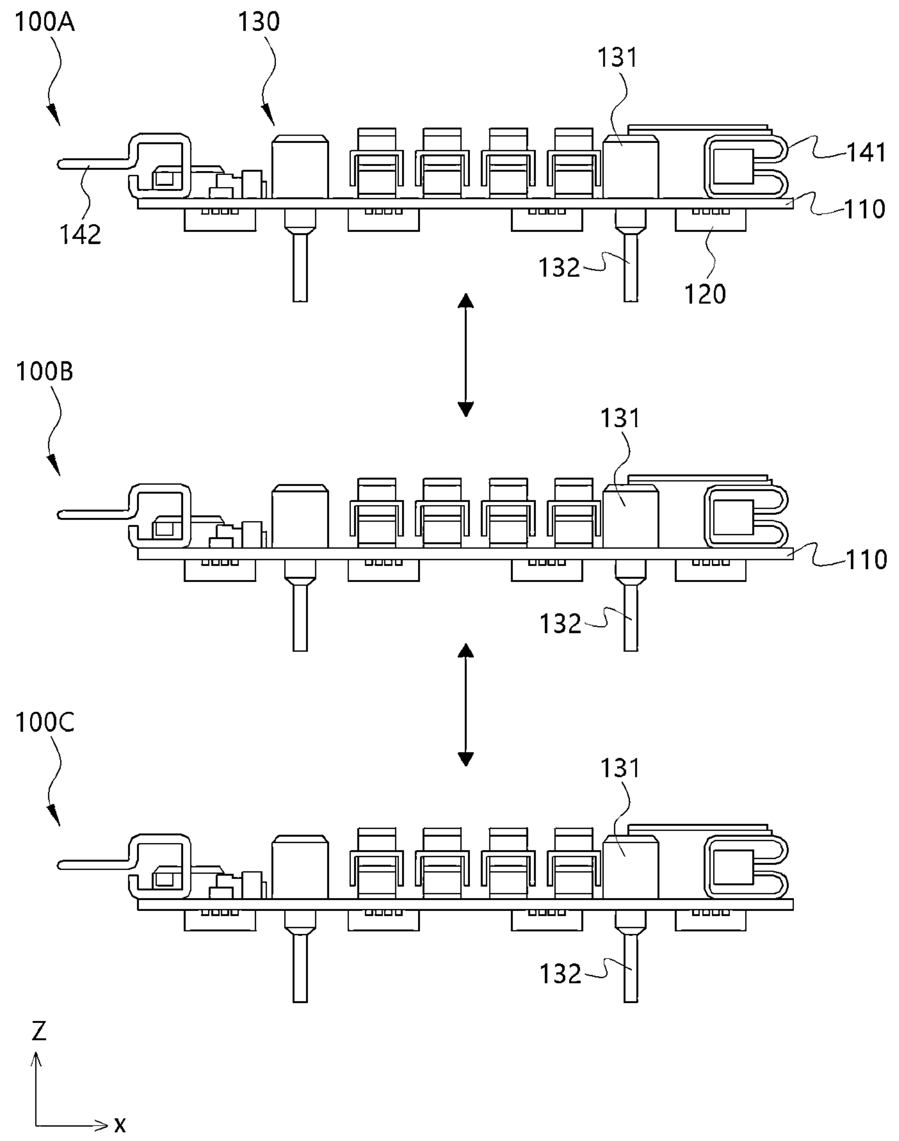
FIG. 3 is an exploded view of a 3D magnetic field measurement device according to an example of the present invention.
Figure 4:
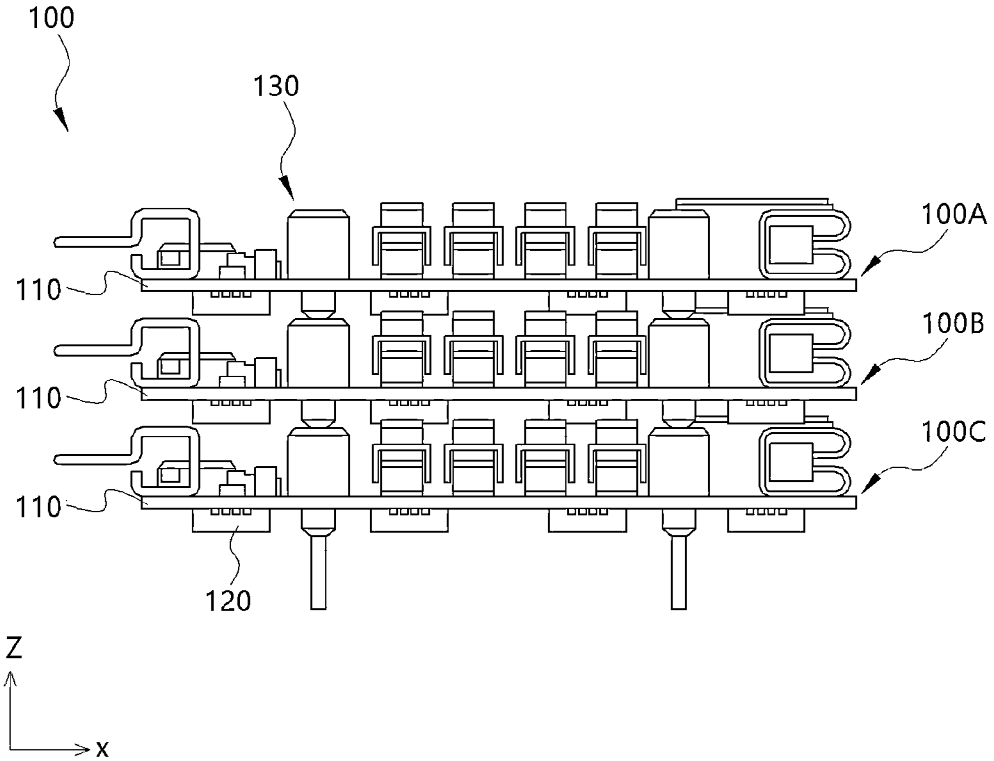
FIG. 4 is a coupling diagram of FIG. 3.
Figure 5:
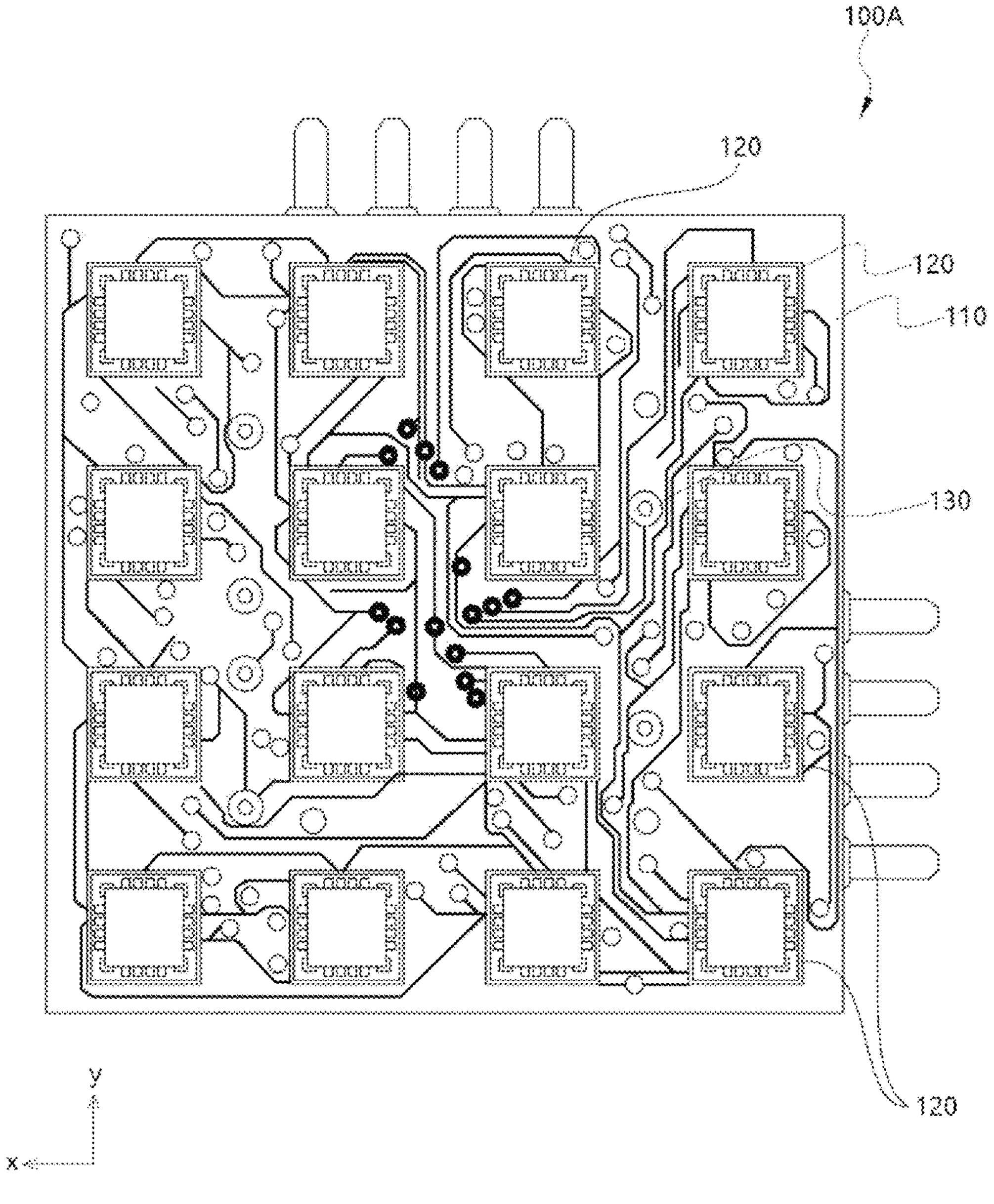
FIG. 5 is a rear view of a module viewed from the bottom.
Figure 6:
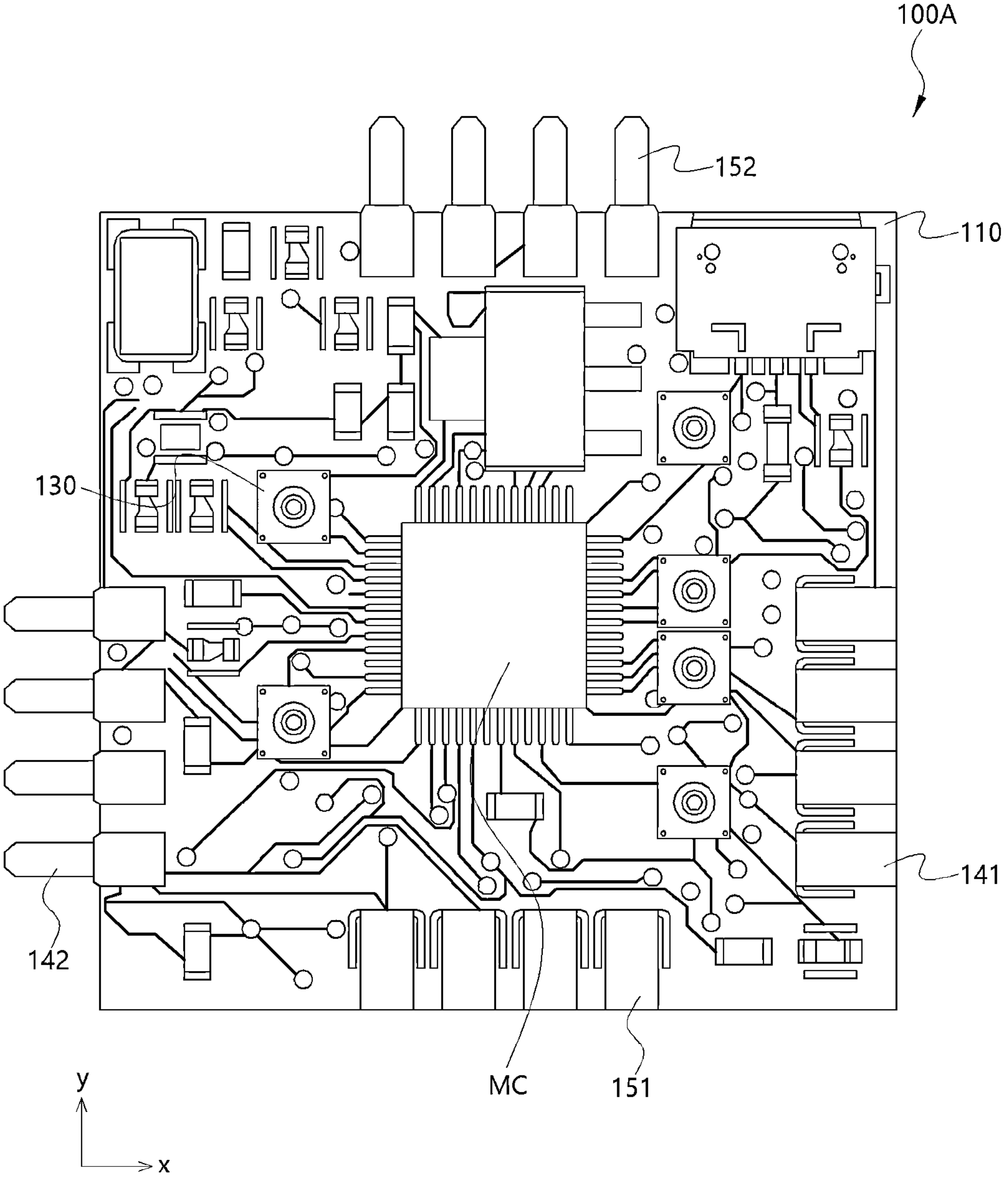
FIG. 6 is a plan view of a module viewed from the top.

FIG. 3 is an exploded view of a three-dimensional (3D) magnetic field measurement device according to an example of the present invention, FIG. 4 is a coupling diagram of FIG. 3, FIG. 5 is a rear view of a module viewed from the bottom, and FIG. 6 is a plan view of a module viewed from the top.

As shown, a 3D magnetic field measurement device 100 of the present invention includes a plurality of modules 100A, 100B, and 100C, and each of the plurality of modules 100A, 100B, and 100C includes at least two or more. FIGS. 3 and 4 illustrate a device including three modules.

Each of the plurality of modules 100A, 100B, and 100C includes a circuit board 110, a plurality of magnetic field sensors 120 mounted on the circuit board 110 and arranged to be apart from each other by a certain distance in x-axis and y-axis directions, and a z-axis connection portion 130 provided on the circuit board 110.

At this time, each of the plurality of modules 100A, 100B, and 100C is separably connected in the z-axis direction through the z-axis connection portion 130 of each module, enabling measurement of x-axis, y-axis, and z-axis magnetic fields.

It is desirable to adopt a method for easy coupling and disassembly between each module 100A, 100B, and 100C. For example, connection methods that require an additional component or equipment for coupling and disassembly, such as bolting or welding, may be excluded.

The magnetic field sensor 120 is a sensor that detects a magnetic field. A plurality of magnetic field sensors may be mounted on the circuit board 110. Here, the plurality of magnetic field sensors 120 are arranged to be spaced apart from each other by a certain distance on the x-axis and y-axis, so that each of the modules 100A, 100B, and 100C may measure the magnetic field in the x-y plane. In addition, in the 3D magnetic field measurement device 100 of the present invention, as the plurality of modules 100A, 100B, and 100C are connected in the z-axis direction by the z-axis connection portion 130 of each of the modules 100A, 100B, and 100C, the 3D magnetic field measurement device 100 may measure magnetic fields in the x-axis, y-axis, and z-axis spaces in real time without moving the device.

In other words, the 3D magnetic field measurement device 100 of the present invention may measure the 3D magnetic field at the current location of the device without moving the device and may simultaneously measure magnetic field data in real time.

Accordingly, by combining the real-time measurement ability of the 3D magnetic field measurement device 100 of the present invention with artificial intelligence-enhanced learning, optimal conditions for magnetic field control and driving of a microrobot capable of controlling magnetic fields may be derived and magnetic field characteristics and inspection of a permanent magnet and electromagnet-based system may be efficiently performed, through which companies manufacturing magnetic field systems may more quickly and accurately evaluate the performance of a developed magnetic field system.

In addition, the 3D magnetic field measurement device 100 of the present invention may be manufactured at a lower price than similar conventional products, and may be used as a device for developing a magnetic field control system or as a device for magnetic field education in companies and educational institutions.

Referring back to FIGS. 3 and 4, the z-axis connection portion 130 of each module (e.g., 100B) may include a z-axis insertion portion 131 formed on one surface (e.g., an upper surface) of the circuit board 110 and a z-axis protrusion portion 132 formed on the other surface (e.g., a lower surface) of the circuit board 110 and inserted into the z-axis insertion portion 131 of another module (e.g., 100A) adjacent in the z-axis direction. The z-axis connection portion 130 is a component for connecting each module 100A, 100B, and 100C in the z-axis direction, and as the z-axis protrusion portion 132 of any one module 100A, among two adjacent modules (e.g., 100A and 100B) is configured to be inserted into the first insertion portion 131 of another module 100B, a plurality of modules 100A, 100B, and 100C are stacked in the z-axis direction.

Since the z-axis connection portion 130 includes the z-axis insertion portion 131 and the z-axis protrusion portion 132, when the plurality of modules 100A, 100B, and 100C are connected to each other in the z-axis direction, a distance between each module 100A, 100B, and 100C in the z-axis direction may be minimized. Accordingly, a magnetic field formed in the z-axis may be measured more densely, thereby improving measurement reliability and accuracy.

The z-axis connection portion 130 may electrically connect power and signals of different modules 100A, 100B, and 100C. That is, the z-axis connection portion 130 is configured to not only physically connect each module 100A, 100B, and 100C in the z-axis direction, but also to connect them electrically, thereby enabling power and signal transmission between the plurality of modules 100A, 100B, and 100C.

Figure 7:
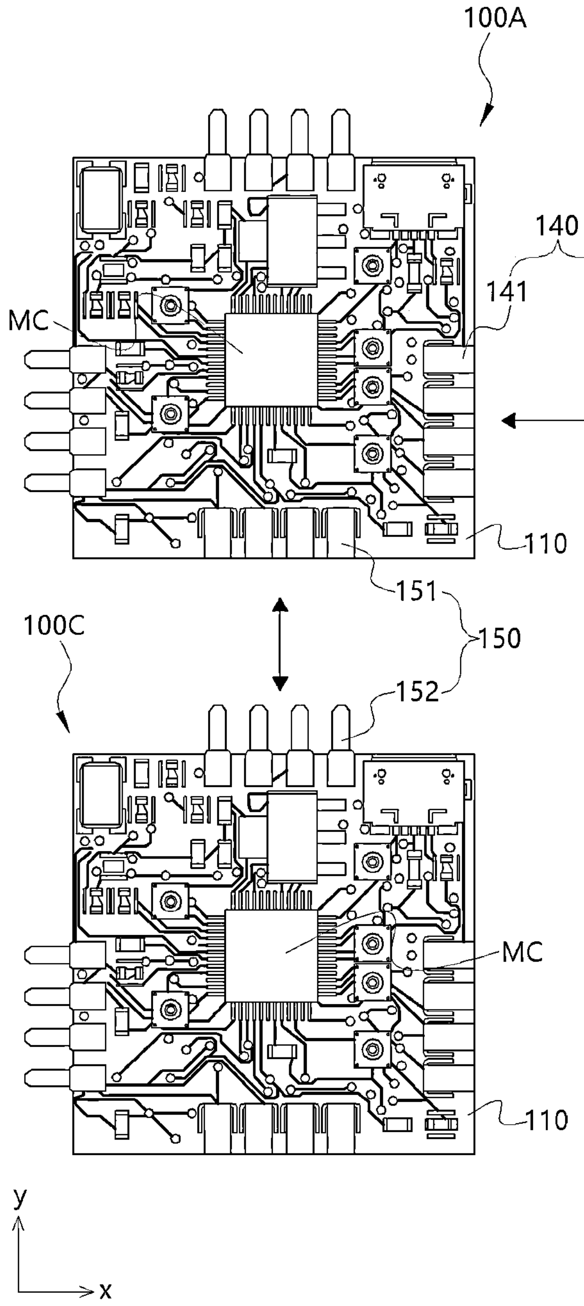
FIG. 7 is an exploded view of a 3D magnetic field measurement device according to another example of the present invention.
Figure 8:
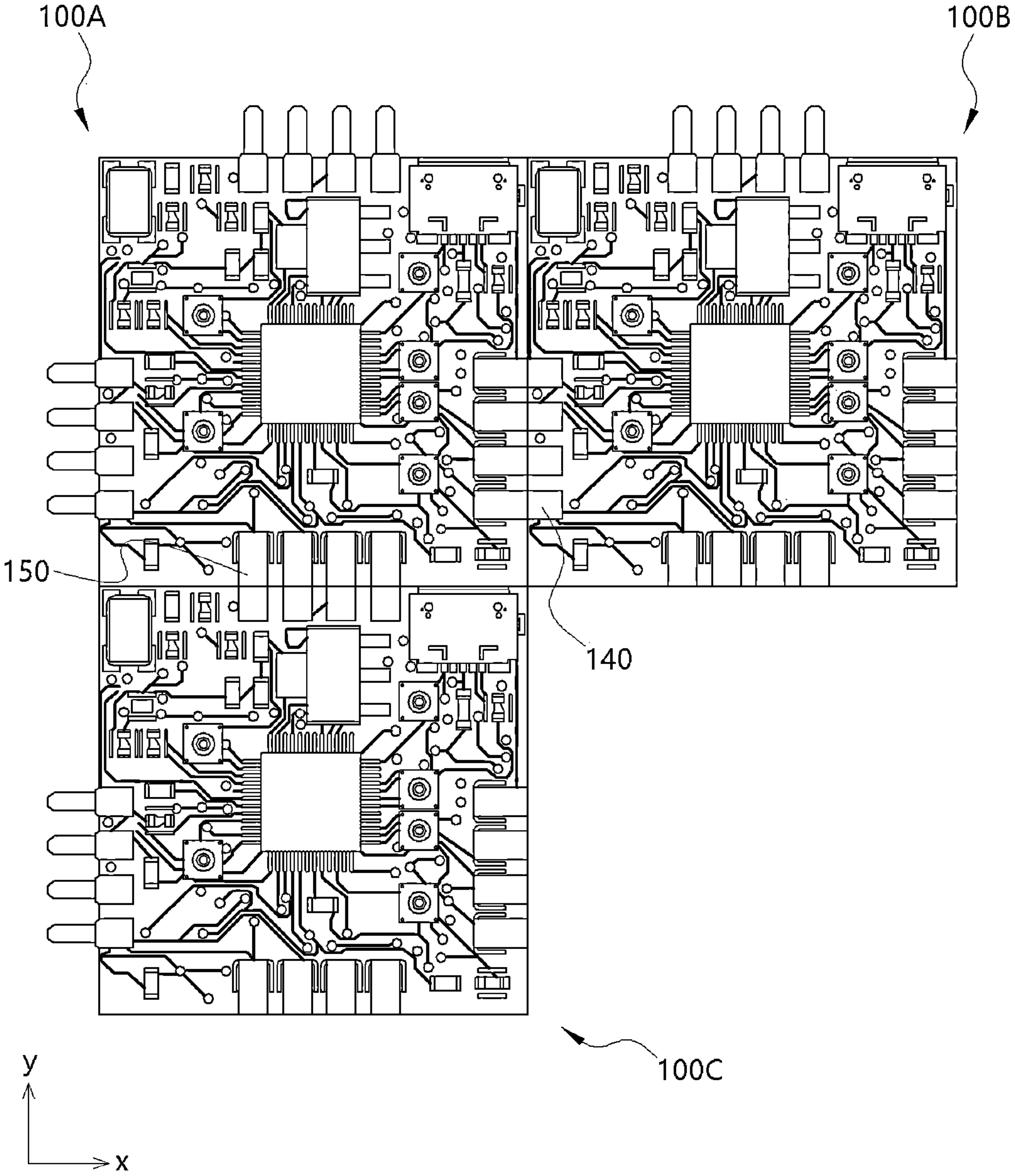
FIG. 8 is a coupling diagram of FIG. 7.

FIG. 7 is an exploded view of a 3D magnetic field measurement device according to another example of the present invention, and FIG. 8 is a coupling diagram of FIG. 7.

Referring to FIGS. 7 and 8, each module 100A, 100B, and 100C may further include an x-axis connection portion 140 that connects the different modules 100A, 100B, and 100C in the x-axis direction. That is, the modules (e.g., 100A and 100B) adjacent to each other in the x-axis direction may extend to be connected to each other in the x-axis direction through the x-axis connection portion 140. Accordingly, the 3D magnetic field measurement device 100 of the present invention may expand a measurement range in the x-axis direction through the x-axis connection portion 140 to acquire real-time magnetic field data, without moving the modules 100A, 100B, and 100C according to the measurement range. At this time, the x-axis connection portion 140 may not only physically connect the two adjacent modules 100A and 100B in the x-axis direction, but also electrically connect power and signals of the two adjacent modules 100A and 100B.

At this time, the x-axis connection portion 140 of each module (e.g., 100B) may include an x-axis insertion portion 141 formed in a positive x-axis direction and an x-axis protrusion portion 142 formed in a negative x-axis direction and inserted into the insertion portion 141 of another adjacent module (e.g., 100A).

The x-axis insertion portion 141 and the x-axis protrusion portion 142 may be formed in each module 100A, 100B, and 100C, and modules (100A and 100B) adjacent in the x-axis direction may be connected by the x-axis connection portion 140 in the x-axis direction. At this time, the x-axis insertion portion 141 and the x-axis protrusion portion 142 may be connected by fitting, and accordingly, positions of the modules 100A and 100B may be supported without a user's hand or additional equipment, thereby preventing a degradation of data measurement reliability due to movement of the modules 100A and 100B, and since a distance between the module 100A and module 100B is maintained at a constant interval, a measurement interval may be easily set, thereby increasing measurement reliability.

When the x-axis protrusion portion 142 of one of two adjacent modules in the x-axis direction is inserted into the x-axis insertion portion 141 of the other module, the circuit board 110 formed in each of the two adjacent modules may be in close contact with each other without a space in the x-axis direction. That is, as the plurality of modules 100A and 100B are connected without a gap between the modules connected by the x-axis connection portion 140, the durability of the 3D magnetic field measurement device 100 of the present invention may increase, fatigue transferred to the x-axis connection portion may decrease, and a distance between the plurality of magnetic field sensors 120 respectively mounted on the circuit boards 110 may be minimized, thereby measuring a magnetic field formed on the x-axis at closer intervals.

Referring back to FIGS. 7 and 8, each module 100A, 100B, and 100C may further include a y-axis connection portion 150 that connects the respective different modules 100A, 100B, and 100C in the y-axis direction. That is, modules (e.g., 100A and 100C) adjacent in the y-axis direction may extend to be connected to each other in the y-axis direction through the y-axis connection portion 150. Accordingly, the 3D magnetic field measurement device 100 of the present invention may expand a measurement range in the y-axis direction through the y-axis connection portion 150 to acquire real-time magnetic field data, without moving the modules 100A, 100B, and 100C according to the measurement range. At this time, the y-axis connection portion 150 may not only physically connect the two adjacent modules 100A and 100C in the y-axis direction but also electrically connect power and signals of the two adjacent modules 100A and 100C.

At this time, the y-axis connection portion 150 of each module (e.g., 100A) may include a y-axis insertion portion 151 formed in a negative y-axis direction and a y-axis insertion portion 151 formed in a positive y-axis direction and inserted into the insertion portion 151 of another adjacent module (e.g., 100C).

The y-axis insertion portion 151 and the y-axis protrusion portion 152 may be formed in each module 100A, 100B, and 100C, and the modules (100A and 100C) adjacent in the y-axis direction may be connected in the y-axis direction by the y-axis connection portion 150. At this time, the y-axis insertion portion 151 and the y-axis protrusion portion 152 may be connected by fitting, and accordingly, the positions of each module 100A, 100B, and 100C may be supported without the user's hand or additional equipment, thereby preventing a deterioration of data measurement reliability due to movement of the modules 100A and 100C, and since the distance between the modules 100A and 100C is maintained at a constant interval, a measurement interval may be easily set, thereby increasing measurement reliability.

When the y-axis protrusion portion 152 of one of two adjacent modules in the y-axis direction is inserted into the y-axis insertion portion 151 of the other module, the circuit boards 110 respectively formed in the two adjacent modules may be in close contact with each other without a space in the y-axis direction. That is, as the plurality of modules 100A and 100C are connected without a gap between the modules connected by the y-axis connection portion 150, the durability of the 3D magnetic field measurement device 100 of the present invention may increase, fatigue transferred to the y-axis connection portion may decrease, and a distance between the plurality of magnetic field sensors 120 respectively mounted on the circuit boards 110 may be minimized, thereby measuring a magnetic field formed on the y-axis at closer intervals.

Meanwhile, the reference numerals 100A, 100B, and 100C representing each module in FIGS. 7 and 8 denote different modules, and do not necessarily correspond identically to 100A, 100B, and 100C representing each module shown in FIGS. 3 and 4. In the present invention, for example, when a plurality of modules gather together to have a three-layer stack structure, each layer may have a structure in which a plurality of modules are connected in at least one direction of the x-axis and the y-axis, and in this case, each layer may have the same structure (i.e., the same number of modules and the same connection type between modules) or may have a different structure (i.e., a different number of modules or a different connection type between modules).

Figure 9:
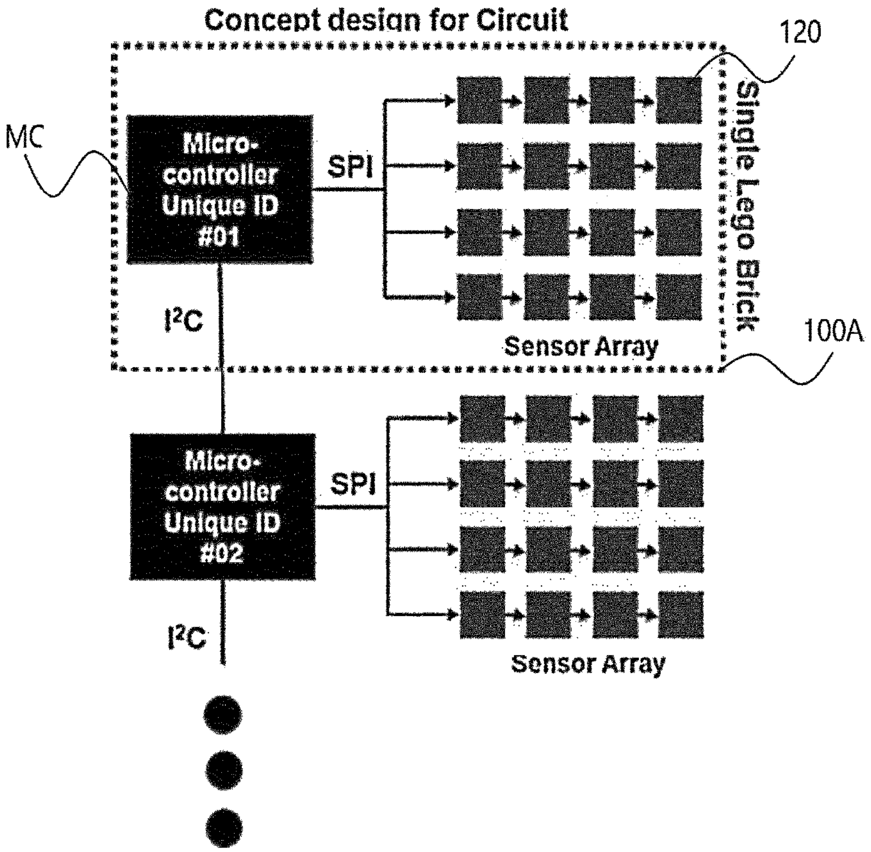
FIG. 9 is an operation block diagram of a 3D magnetic field measurement device system according to an example of the present invention.

FIG. 9 is an operation block diagram of a 3D magnetic field measurement device system according to an example of the present invention. Referring to FIG. 9, serial peripheral interface (SPI) communication may be performed between a microcontroller (MC) formed on the circuit board 110 and a plurality of magnetic field sensors 120, and $I^2C$ communication may be performed between microcontrollers (MCs) formed in different modules 100A, 100B, and 100C.

In order to achieve miniaturization and weight reduction of the 3D magnetic field measurement device 100 of the present invention, it is very important to select a communication protocol to minimize the number of physical and electrical connections, and in the present invention, an $I^2C$ protocol suitable for such a Lego-type connection system may be used.

Figure 10:
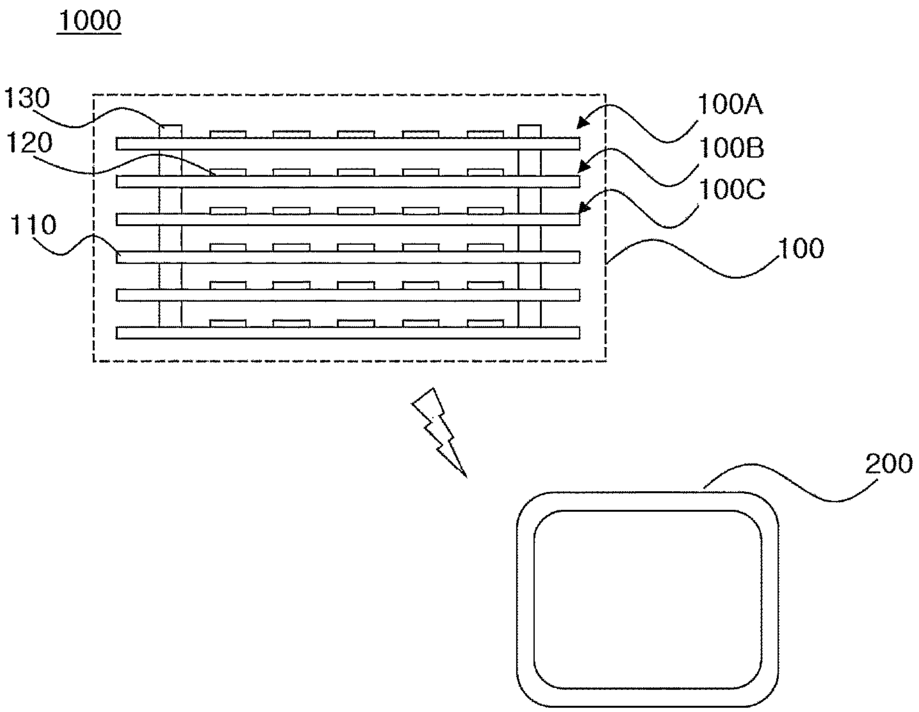
FIG. 10 is a schematic diagram illustrating a magnetic field mapping system according to an example of the present invention.

FIG. 10 is a configuration diagram schematically illustrating a magnetic field mapping system according to an example of the present invention. As shown, a magnetic field mapping system 1000 of the present invention includes the 3D magnetic field measurement device 100 described above and an output device 200 that receives magnetic field data of a plurality of modules 100A, 100B, and 100C from the 3D magnetic field measurement device 100 and generates a 3D magnetic field graph in real time.

The magnetic field mapping system 1000 of the present invention may measure a magnetic field according to the size and shape of an area for which magnetic field data is to be obtained through assembly or disassembly of the plurality of modules 100A, 100B, and 100C of the 3D magnetic field measurement device 10, and the output device 200 may flexibly map the magnetic field through the magnetic field data acquired from the 3D magnetic field measurement device 100.

In addition, the 3D magnetic field measurement device 100 may further include a master module electrically connecting power and signals between the plurality of modules 100A, 100B, and 100C, connected to any one of the plurality of modules 100A, 100B, and 100C, and connected to the output device 200.

In addition, the output device 200 may generate a 3D magnetic field graph by setting spatial information of the plurality of magnetic field sensors based on an arrangement interval of the plurality of magnetic field sensors 120 of the 3D magnetic field measurement device 100 and a connection interval between the plurality of modules 100A, 100B, and 100C. That is, the output device 200 may specify the positions of the plurality of magnetic field sensors 120 through the spatial information and output the magnetic field graph in 3D space based thereon.

Figure 11:
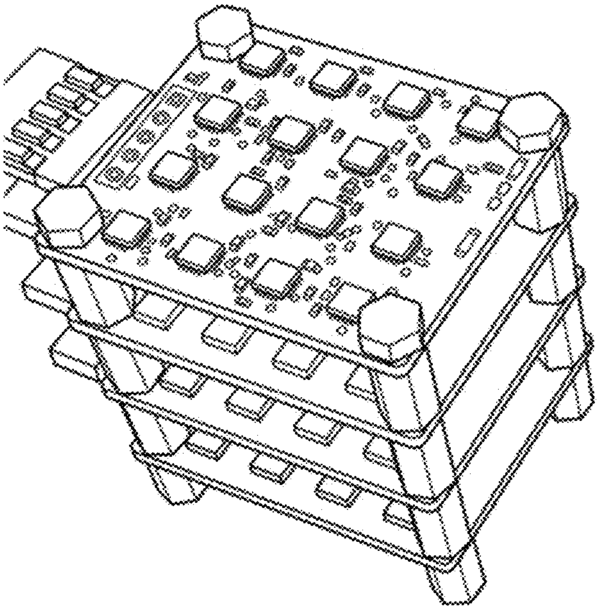
FIG. 11 is a diagram illustrating an actual photograph of a 3D magnetic field measurement device according to an example of the present invention and a graph of 3D magnetic field strength and direction data.
Figure 11:
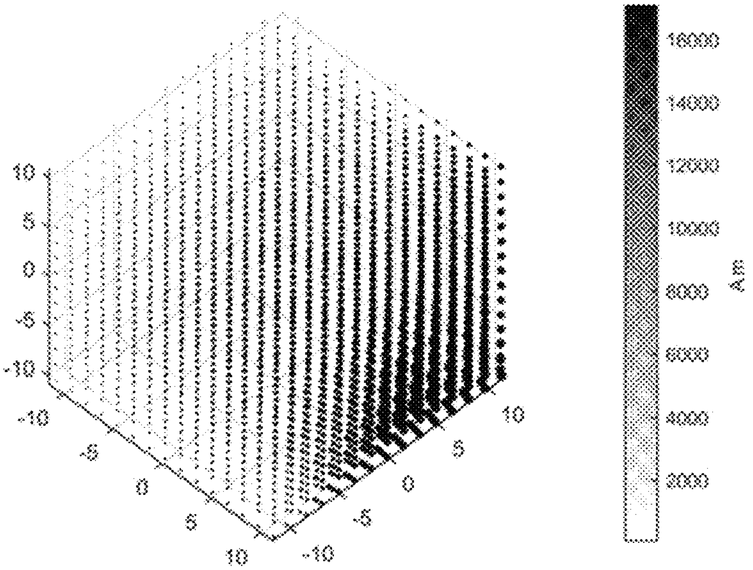
Figure 12:
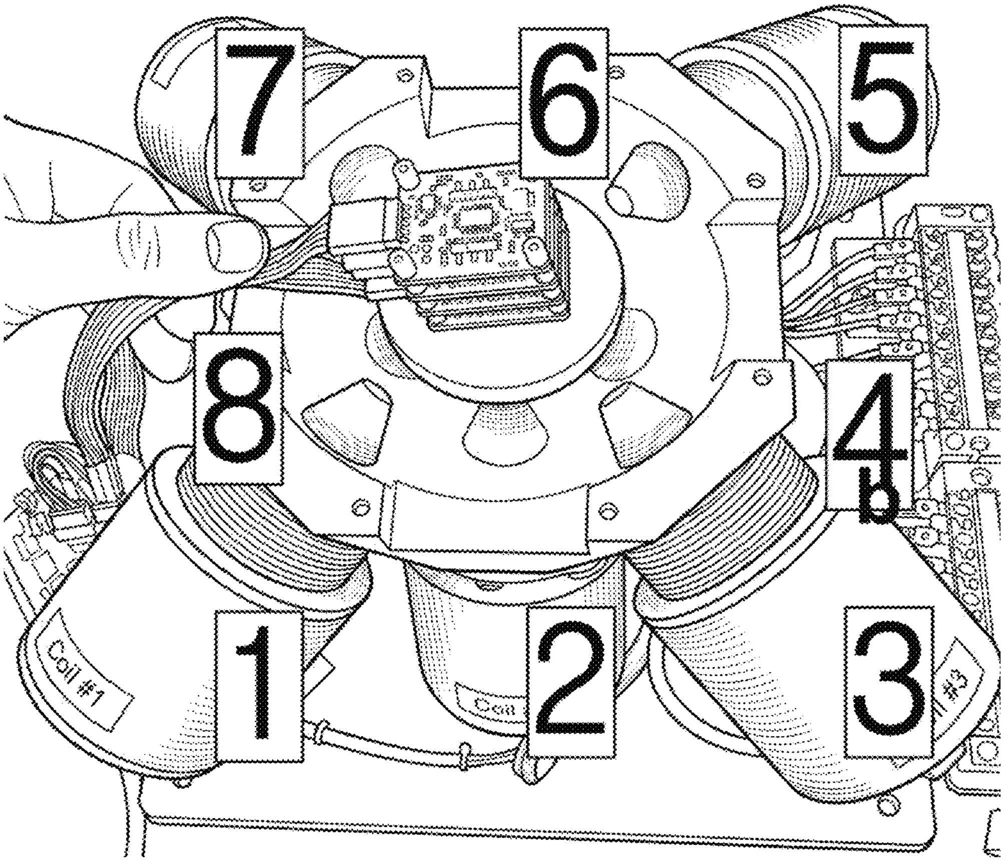
FIG. 12 is a diagram illustrating an actual photograph of an evaluation of characteristics of an electromagnet-based magnetic field control system according to an example of the present invention, and a graph of 3D magnetic field strength and direction data.

FIG. 11 is a diagram illustrating an actual photograph of a 3D magnetic field measurement device according to an example of the present invention and a graph of 3D magnetic field strength and direction data, and FIG. 12 is a diagram illustrating an actual photograph of an evaluation of characteristics of an electromagnet-based magnetic field control system according to an example of the present invention, and a graph of 3D magnetic field strength and direction data.

Referring to FIG. 11, in the magnetic field mapping system 1000 of the present invention, the 3D magnetic field measurement device 100 may measure 3D magnetic field data, and the output device 200 may generate magnetic field strength and direction data using the magnetic field data measured by the 3D magnetic field measurement device 100.

Referring to FIG. 12, the magnetic field mapping system 1000 of the present invention may evaluate the characteristics of an electromagnet-based magnetic field control system. The 3D magnetic field measurement device 100 may be disposed in different positions within a certain area of the magnetic field control system to measure a 3D magnetic field, and the output device 200 may three-dimensionally output the magnetic field data measured by the 3D magnetic field measurement device 100, thereby evaluating and inspecting the characteristics of the magnetic field control system.

Figure 13:
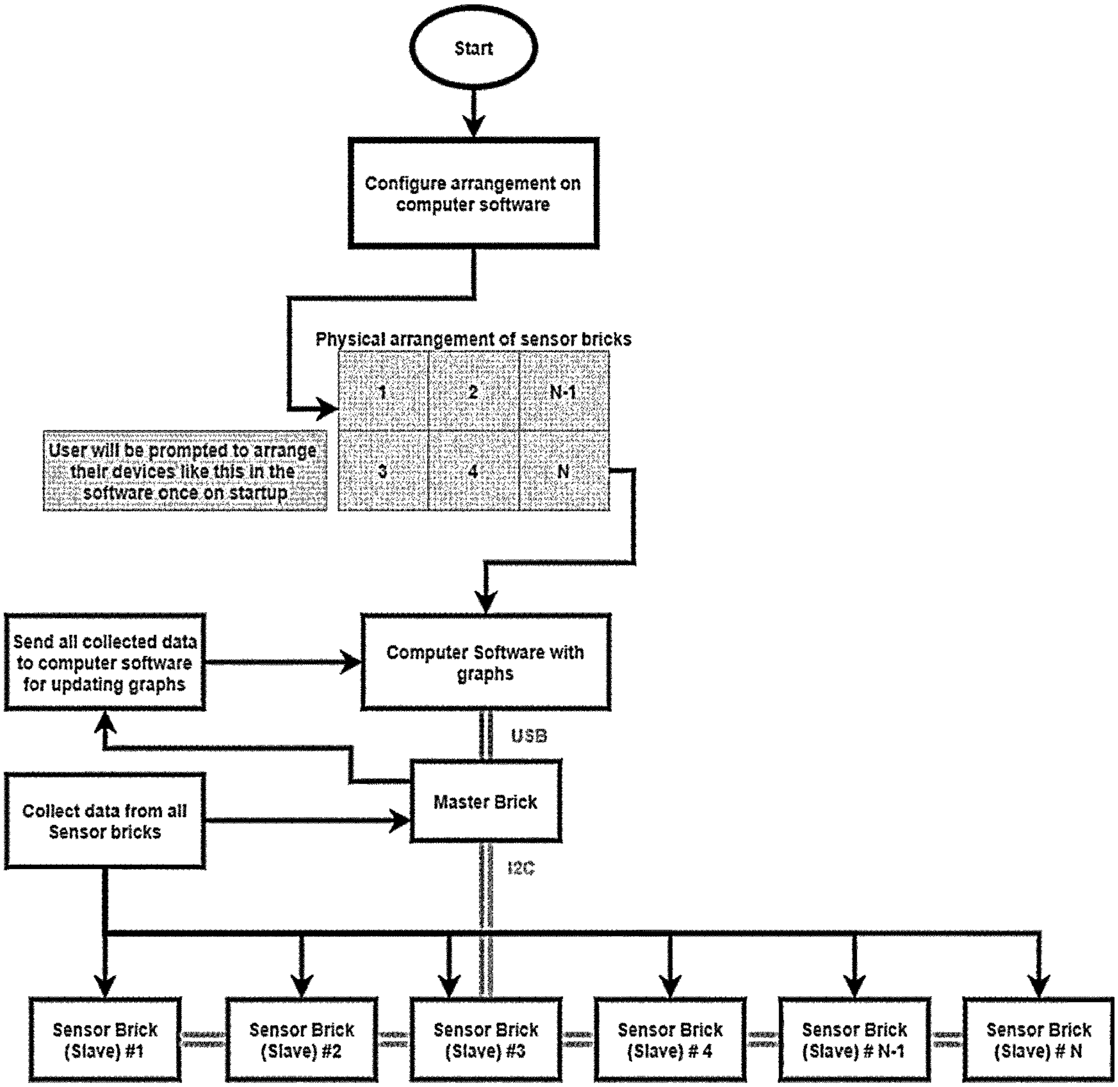
FIG. 13 is a flowchart of magnetic field data transmission and reception of a magnetic field mapping system according to an example of the present invention.
Figure 14:
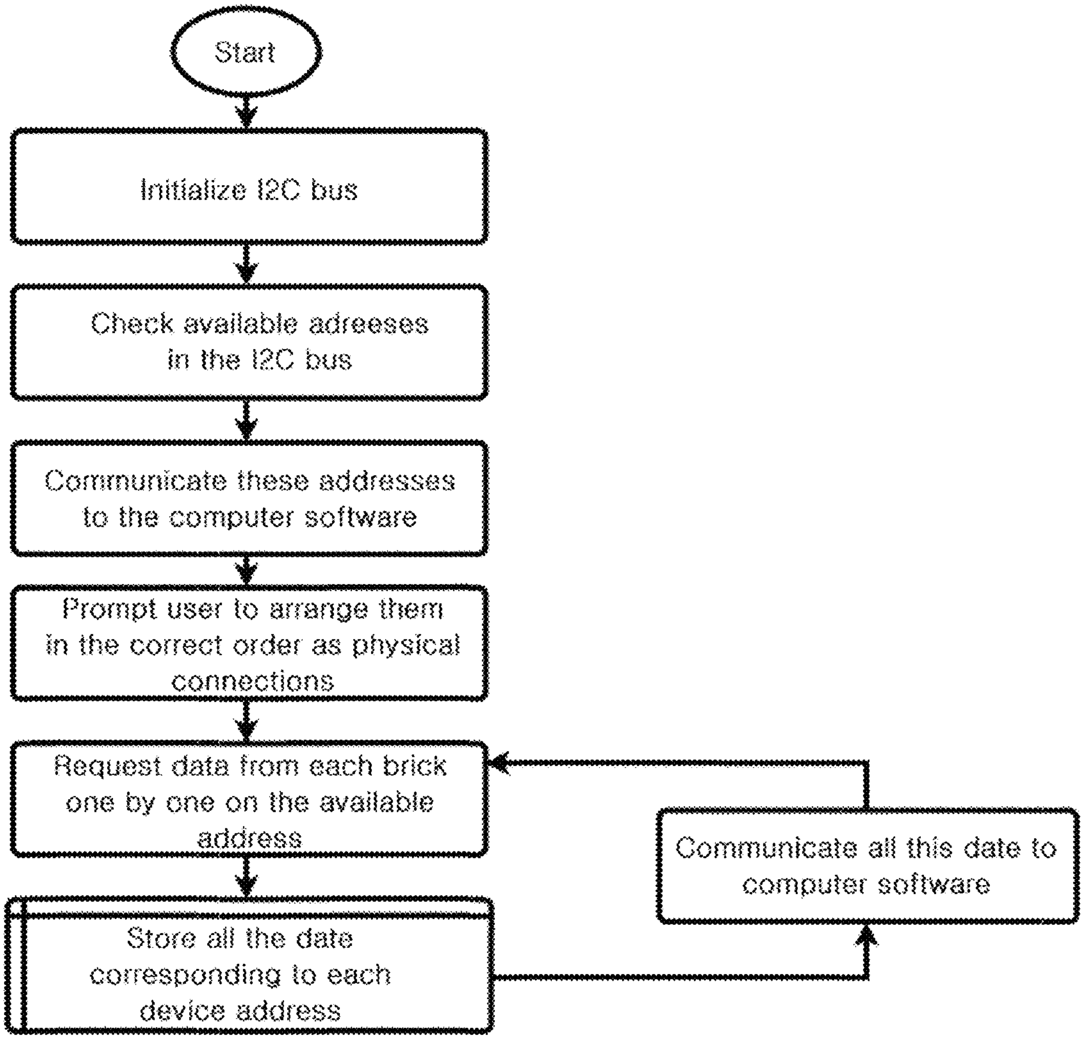
FIG. 14 is a flowchart of magnetic field data transmission and reception of a master module according to an example of the present invention.
Figure 15:
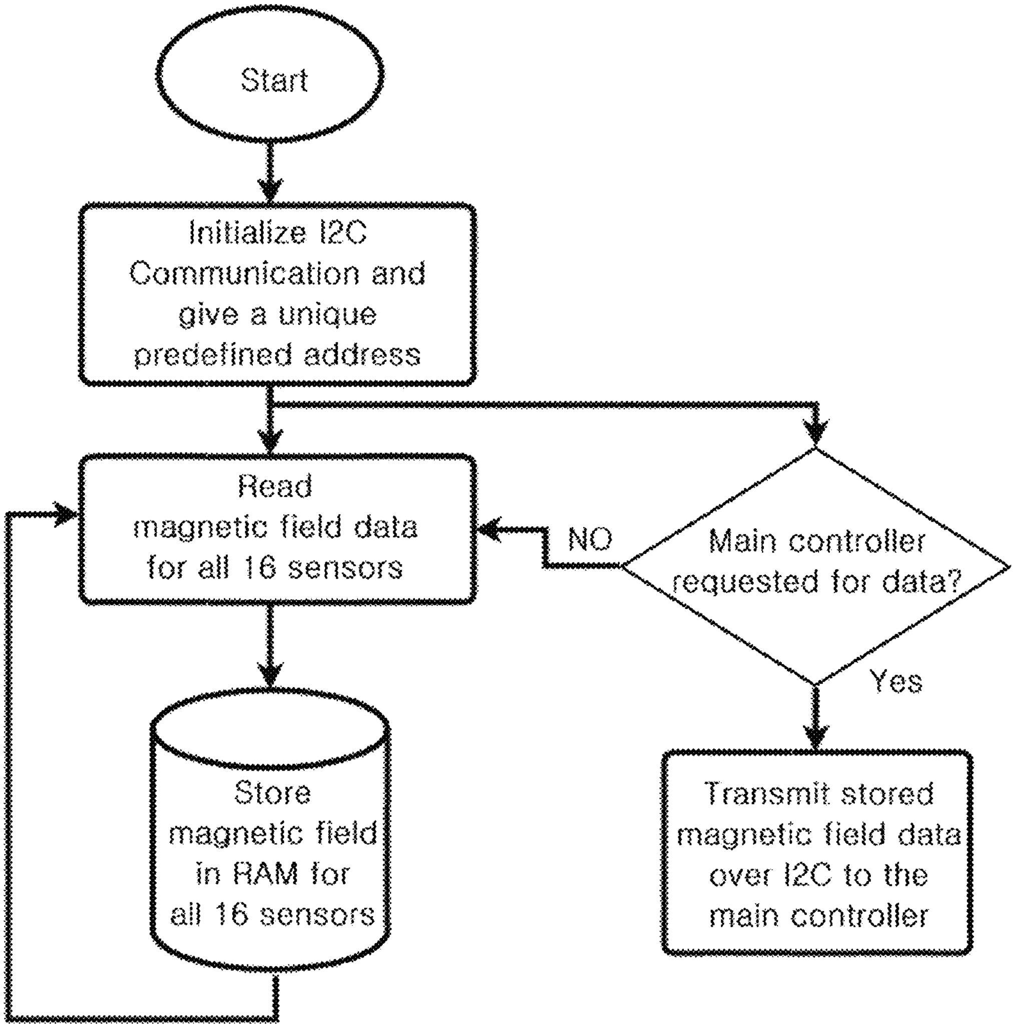
FIG. 15 is a flowchart of magnetic field data transmission and reception of a module according to an example of the present invention.

FIG. 13 is a flowchart of magnetic field data transmission and reception of a magnetic field mapping system according to an example of the present invention, FIG. 14 is a flowchart of magnetic field data transmission and reception of a master module according to an example of the present invention, and FIG. 15 is a flowchart of magnetic field data transmission and reception of a module according to an example of the present invention.

Magnetic field data transmission and reception steps of the magnetic field mapping system 1000 of the present invention are described as follows with reference to FIG. 13. 1) An address is created for each module, and the address number is physically assigned to the case of each module. The user arranges and configures the modules in a table. 2) After the arrangement is completed, computer software communicates with a master module connected to any one of the plurality of modules and updates the graph. 3) The master module communicates with each module and stores data in the computer software. 4) After the master module sends data to all modules, the data is drawn as a graph on a computer screen. At this time, spatial information generated based on physical information, such as the arrangement interval of a plurality of magnetic field sensors and a connection interval between a plurality of modules is set, so that the position of each sensor may be known. 5) Steps 3 and 4 repeat infinitely and data may be obtained in real time.

Magnetic field data transmission and reception steps of the master module are described as follows with reference to FIG. 14. 1) The master module performs initial setup of $I^2C$ communication. 2) The numbers of modules are checked and the address of each module is stored. 3) The address of each module is sent to the output device for arrangement and configuration to make module a table. 4) Each module is interrupted with the previously acquired address and the magnetic field data is stored. 5) Communication is performed with the output device to update the graph with the stored data. 6) Steps 4 and 5 are repeated.

Magnetic field data transmission and reception steps of the module are described as follows with reference to FIG. 15. 1) Each module receives a pre-assigned unique address. $I^2C$ communication is initialized and started. 2) The module continuously obtains and updates data until interrupted. 3) When interrupted, the module sends data to the master module.

The present invention is not limited to the aforementioned exemplary embodiments, and may be variously modified without departing from the gist of the present invention as claimed in the claims.

DETAILED DESCRIPTION OF MAIN ELEMENTS

1000: Magnetic field mapping system
100: 3D magnetic field measurement device
100A, 100B, and 100C: module
110: circuit board
120: magnetic field sensor
130: z-axis connection portion
131: z-axis insertion portion
132: z-axis protrusion portion
140: x-axis connection portion
141: x-axis insertion portion
142: x-axis protrusion portion
150: y-axis connection portion
151: y-axis insertion portion
152: y-axis protrusion portion
MC: microcontroller
200: output device

The invention claimed is:

1. A three-dimensional (3D) magnetic field measurement device comprising:
a plurality of modules,
wherein each of the plurality of modules includes:
a circuit board;
a plurality of magnetic field sensors mounted on the circuit board, arranged to be spaced apart from each other by a predetermined distance in x-axis and y-axis directions;
an x-axis connection portion connecting different modules in the x-axis direction; and
a z-axis connection portion formed on the circuit board,
wherein the plurality of modules are separably connected in a z-axis direction by the z-axis connection portion, enabling measurement of x-axis, y-axis, and z-axis magnetic fields,
wherein the x-axis connection portion includes:
an x-axis insertion portion formed in a positive x-axis direction,
an x-axis protrusion portion formed in a negative x-axis direction and inserted into the x-axis insertion portion of another module adjacent in the x-axis direction, and
wherein the z-axis connection portion electrically connects power and signals of different modules.

2. The 3D magnetic field measurement device of claim 1, wherein
the z-axis connection portion includes:
a z-axis insertion portion formed on one surface of the circuit board; and
a z-axis protrusion portion formed on the other surface of the circuit board and inserted into a first insertion portion of another module adjacent in the z-axis direction.

3. The 3D magnetic field measurement device of claim 1, wherein,
when the x-axis protrusion portion is inserted into the x-axis insertion portion, the circuit boards respectively formed in the different modules are in close contact with each other without a space in the x-axis direction.

4. The 3D magnetic field measurement device of claim 1, wherein
serial peripheral interface (SPI) communication is performed between a microcontroller formed on the circuit board and the plurality of magnetic field sensors, and
I2C communication is performed between the microcontrollers formed in different modules.

5. A magnetic field mapping system comprising:
the 3D magnetic field measurement device of claim 1; and
an output device receiving magnetic field data of the plurality of modules from the 3D magnetic field measurement device and generating a 3D magnetic field graph in real time.

6. The magnetic field mapping system of claim 5, wherein the 3D magnetic field measurement device further includes a master module electrically connecting power and signals between the plurality of modules, connected to one of the plurality of modules, and connected to the output device.

7. The magnetic field mapping system of claim 5, wherein the output device generates the 3D magnetic field graph by setting spatial information of the plurality of magnetic field sensors based on an arrangement interval of the plurality of magnetic field sensors of the 3D magnetic field measurement device and a connection interval between the plurality of modules.

8. A three-dimensional (3D) magnetic field measurement device comprising:
a plurality of modules,
wherein each of the plurality of modules includes:
a circuit board;
a plurality of magnetic field sensors mounted on the circuit board, arranged to be spaced apart from each other by a predetermined distance in x-axis and y-axis directions;
a y-axis connection portion connecting different modules in the y-axis direction; and
a z-axis connection portion formed on the circuit board,
wherein the plurality of modules are separably connected in a z-axis direction by the z-axis connection portion, enabling measurement of x-axis, y-axis, and z-axis magnetic fields,
wherein the y-axis connection portion includes:
a y-axis insertion portion formed in a negative y-axis direction,
a y-axis protrusion portion formed in a positive y-axis direction and inserted into the y-axis insertion portion of another module adjacent in the y-axis direction, and
wherein the z-axis connection portion electrically connects power and signals of different modules.

9. The 3D magnetic field measurement device of claim 8, wherein the z-axis connection portion includes:
a z-axis insertion portion formed on one surface of the circuit board, and
a z-axis protrusion portion formed on the other surface of the circuit board and inserted into a first insertion portion of another module adjacent in the z-axis direction.

10. The 3D magnetic field measurement device of claim 8, wherein, when the y-axis protrusion portion is inserted into the y-axis insertion portion, the circuit boards respectively formed in the different modules are in close contact with each other without a space in the y-axis direction.

11. A magnetic field mapping system comprising:
the 3D magnetic field measurement device of claim 8; and an output device receiving magnetic field data of the plurality of modules from the 3D magnetic field measurement device and generating a 3D magnetic field graph in real time.

12. The magnetic field mapping system of claim 11, wherein the 3D magnetic field measurement device further includes a master module electrically connecting power and signals between the plurality of modules, connected to one of the plurality of modules, and connected to the output device.

13. The magnetic field mapping system of claim 11, wherein the output device generates the 3D magnetic field graph by setting spatial information of the plurality of magnetic field sensors based on an arrangement interval of the plurality of magnetic field sensors of the 3D magnetic field measurement device and a connection interval between the plurality of modules.

* * * * *